United States Patent
Thakur et al.

(10) Patent No.: US 9,385,689 B1
(45) Date of Patent: Jul. 5, 2016

(54) OPEN LOOP BAND GAP REFERENCE VOLTAGE GENERATOR

(71) Applicant: FREESCALE SEMICONDUCTOR, INC., Austin, TX (US)

(72) Inventors: Nishant Singh Thakur, Pradesh (IN); Pralay Mandal, Kolkata (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/881,176

(22) Filed: Oct. 13, 2015

(51) Int. Cl.
| | |
|---|---|
| G05F 1/10 | (2006.01) |
| G05F 3/02 | (2006.01) |
| H03K 3/011 | (2006.01) |
| H03K 3/0233 | (2006.01) |
| G05F 3/26 | (2006.01) |
| G05F 3/30 | (2006.01) |

(52) U.S. Cl.
CPC ............... *H03K 3/011* (2013.01); *G05F 3/267* (2013.01); *G05F 3/30* (2013.01); *H03K 3/02335* (2013.01)

(58) Field of Classification Search
CPC ........... G05F 3/30; G05F 3/267; G05F 3/262; G05F 3/205; G05F 3/22; G05F 3/222; G05F 3/242; G05F 3/225; G05F 3/245; G05F 3/20; G11C 5/147

USPC .......... 327/539–541, 543, 512, 513; 323/313, 323/315
See application file for complete search history.

(56) References Cited

U.S. PATENT DOCUMENTS

| | | | |
|---|---|---|---|
| 5,144,159 | A | 9/1992 | Frisch et al. |
| 5,214,316 | A | 5/1993 | Nagai |
| 5,982,201 | A | 11/1999 | Brokaw et al. |
| 6,346,803 | B1 * | 2/2002 | Grossnickle et al. ......... 323/315 |
| 6,847,240 | B1 | 1/2005 | Zhou |
| 7,190,212 | B2 | 3/2007 | Shor et al. |
| 7,224,210 | B2 | 5/2007 | Garlapati et al. |
| 7,411,443 | B2 | 8/2008 | Ivanov et al. |
| 7,486,065 | B2 | 2/2009 | Lin et al. |
| 7,570,090 | B2 | 8/2009 | Du |
| 7,821,307 | B2 | 10/2010 | Chellappa |
| 8,305,068 | B2 | 11/2012 | Galeano et al. |
| 8,803,580 | B2 | 8/2014 | Shi et al. |
| 2003/0111698 | A1 * | 6/2003 | Narendra et al. ............. 257/401 |
| 2006/0006858 | A1 * | 1/2006 | Chiu ............................. 323/313 |
| 2009/0140776 | A1 * | 6/2009 | Hirai ............................. 327/103 |
| 2010/0156190 | A1 * | 6/2010 | Mizuno ........................... 307/77 |

* cited by examiner

*Primary Examiner* — Quan Tra
(74) *Attorney, Agent, or Firm* — Charles E. Bergere

(57) ABSTRACT

A reference voltage generator that does not require a start-up circuit or a feedback loop generates a proportional-to-absolute-temperature (PTAT) output voltage based on two complementary-to-absolute-temperature (CTAT) currents. The reference voltage generator provides a reference voltage that is a sum of the PTAT output voltage and a CTAT voltage.

20 Claims, 4 Drawing Sheets

OPEN LOOP BAND GAP REFERENCE VOLTAGE GENERATOR

BACKGROUND

The present invention generally relates to integrated circuits, and, more particularly, to a reference voltage generator.

Integrated circuits (ICs), including systems-on-chips (SoC), include reference voltage generators to regulate supply voltages and provide reference voltage signals to circuits on the IC such as power-on-reset (POR) circuits, and low and high voltage detectors.

One technique for providing a reference voltage signal is to use a forward-biased diode. Since the diode is used in the forward-biased configuration, the voltage drop across the diode is equal to the threshold voltage of the diode, which serves as a reference voltage. However, the threshold voltage of the diode exhibits complementary-to-absolute-temperature (CTAT) characteristics, which vary significantly with temperature. Therefore, the IC could enter a meta-stable state if the threshold voltage goes beyond acceptable limits, which could damage the IC. Further, modern day ICs operate at low supply voltages, and hence, require a reference voltage that is less sensitive to temperature variations. Further, since variation in diode threshold voltages as a percentage of the supply voltage is large, the use of a diode as a reference voltage generator is ill advised for low voltage ICs.

Another technique for providing a reference voltage signal is to use a bandgap reference (BGR) voltage generator. The BGR voltage generator includes a start-up circuit for establishing a desired operating point during power-up, and a feedback loop for generating an accurate reference voltage signal. However, if the start-up circuit fails or malfunctions, the BGR voltage generator may not generate the reference voltage signal at the desired level, which may prevent the IC from booting or may even cause it to boot with a corrupted reference voltage. Further, when the BGR voltage generator is used to generate a reset signal and the IC is powered up, the supply voltage and the reference voltage rise together such that the IC may be released from reset even though the supply voltage is not within accepted limits.

It would be advantageous to have a reference voltage generator that provides a reference voltage signal that is less sensitive to temperature variations and yet does not include a start-up circuit or feedback loop.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
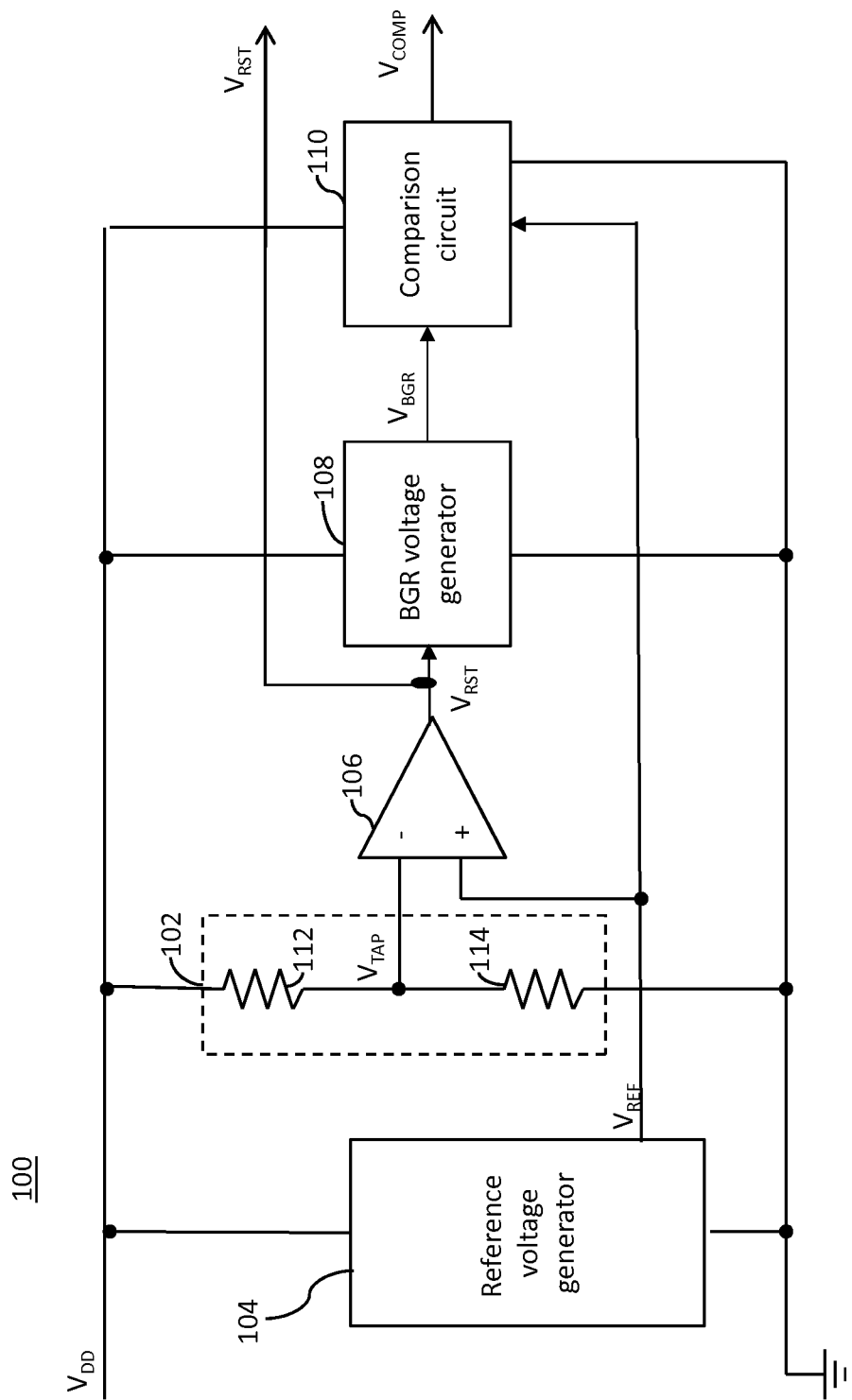
FIG. 1 is a schematic block diagram of an integrated circuit (IC) that includes a reference voltage generator in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a reference voltage generator is provided. The reference voltage generator includes first through third resistors, first through fourth current mirrors, and a diode. The first and second resistors receive a supply voltage and output first and second complementary-to-absolute-temperature (CTAT) reference currents, respectively. The first current mirror, which is connected to ground, receives the first CTAT reference current and generates a first CTAT current. The second current mirror, which also is connected to ground, receives the second CTAT reference current and generates a second CTAT current. The third current mirror is connected to the second current mirror and receives the supply voltage and generates a third CTAT current. The fourth current mirror is connected to the first and third current mirrors, receives the supply voltage, and generates a proportional-to-absolute-temperature (PTAT) output current. The diode has a cathode connected to ground and an anode connected to the third resistor. The third resistor receives the PTAT output current and outputs a reference voltage signal.

In another embodiment of the present invention, a reference voltage generator is provided. The reference voltage generator includes first and second resistors, first through fourth current mirrors, a diode, and a resistive network. The first and second resistors receive a supply voltage and output first and second CTAT reference currents, respectively. The first current mirror, which is connected to ground, receives the first CTAT reference current and generates a first CTAT current. The second current mirror, which also is connected to ground, receives the second CTAT reference current and generates a second CTAT current. The third current mirror is connected to the second current mirror and receives the supply voltage and generates a third CTAT current. The fourth current mirror is connected to the first and third current mirrors and receives the supply voltage and generates first and second PTAT output currents. The diode has a cathode connected to ground and an anode connected to the resistive network. The resistive network receives the first and second PTAT output currents and outputs a reference voltage signal.

In yet another embodiment of the present invention, an integrated circuit (IC) is provided. The IC includes a resistive network, a reference voltage generator, and a comparator. The reference voltage generator includes first through third resistors, first through fourth current mirrors, and a diode. The resistive network receives a supply voltage and outputs a tapped signal. The first and second resistors receive the supply voltage and output first and second CTAT reference currents, respectively. The first current mirror is connected to ground and receives the first CTAT reference current and generates a first CTAT current. The second current mirror is connected to ground and receives the second CTAT reference current and generates a second CTAT current. The third current mirror is connected to the second current mirror and receives the supply voltage and generates a third CTAT current. The fourth current mirror is connected to the first and third current mirrors and receives the supply voltage and generates a PTAT output current. The diode has a cathode connected to ground and an anode connected to the third resistor. The third resistor receives the PTAT output current and outputs a reference voltage signal. The comparator receives the tapped and reference voltage signals and generates a reset signal that is active when a voltage level of the tapped signal is less than a voltage level of the reference voltage signal.

Various embodiments of the present invention provide a reference voltage generator. The reference voltage generator generates a PTAT output current, and hence, a PTAT output voltage based on a difference between two CTAT currents. The reference voltage generator provides a reference voltage that is a sum of the PTAT output voltage and a CTAT voltage. The PTAT output voltage compensates for variations in the reference voltage caused by variations in the CTAT voltage. Thus, the reference voltage generator provides a reference voltage that is less sensitive to temperature variations. Further, the reference voltage generator does not include any startup circuit or feedback loop, and hence, provides a reliable operation.

Referring now to FIG. 1, a schematic block diagram of an integrated circuit (IC) 100 in accordance with an embodiment of the present invention is shown. The IC 100 includes a first resistive network 102, a reference voltage generator 104, a comparator 106, a bandgap reference (BGR) voltage generator 108, and a comparison circuit 110.

In one embodiment, the first resistive network 102 is a voltage divider and includes first and second resistors 112 and 114. The first resistor 112 has a first terminal that receives a supply voltage ($V_{DD}$) from a voltage source (not shown). The second resistor 114 has a first terminal connected to ground and a second terminal connected to a second terminal of the first resistor 112. A tapped signal ($V_{TAP}$) is generated at a node between the first and second resistors 112, 114.

The reference voltage generator 104 is connected between the supply voltage and ground, and provides a reference voltage signal ($V_{REF}$).

The comparator 106 has a first input terminal connected to the first resistive network 102 for receiving the tapped signal $V_{TAP}$ and a second input terminal connected to the reference voltage generator 104 for receiving the reference voltage signal $V_{REF}$. The comparator 106 compares the tapped signal with the reference voltage signal and generates a reset signal ($V_{RST}$) at its output terminal.

The BGR voltage generator 108 is connected to the output terminal of the comparator 106 and receives the reset signal $V_{RST}$. The BGR voltage generator 108 also is connected between the voltage supply and ground, and generates a BGR voltage signal ($V_{BGR}$). The BGR voltage generator 108 is used to provide a temperature-independent low voltage signal to circuits that operate at low voltages.

The comparison circuit 110 is connected to the BGR voltage generator 108 and the reference voltage generator 104 and receives the BGR voltage signal and the reference voltage signal and generates a comparison signal ($V_{COMP}$).

When the tapped voltage $V_{TAP}$ is less than the reference voltage $V_{REF}$, the comparator 106 activates the reset signal, indicating that the supply voltage is below an acceptable level. Thus, components of the IC 100 and other circuits that receive the activate reset signal are reset. When the tapped voltage $V_{TAP}$ is greater than the reference voltage $V_{REF}$, the comparator 106 deactivates the reset signal, indicating that the reference voltage is within acceptable limits. The comparison circuit 110 compares the BGR voltage $V_{BGR}$ with the reference voltage $V_{REF}$, and activates the comparison signal when the $V_{BGR}$ is greater than $V_{REF}$, thereby ensuring that the BGR voltage is within acceptable limits.

Figure 2:
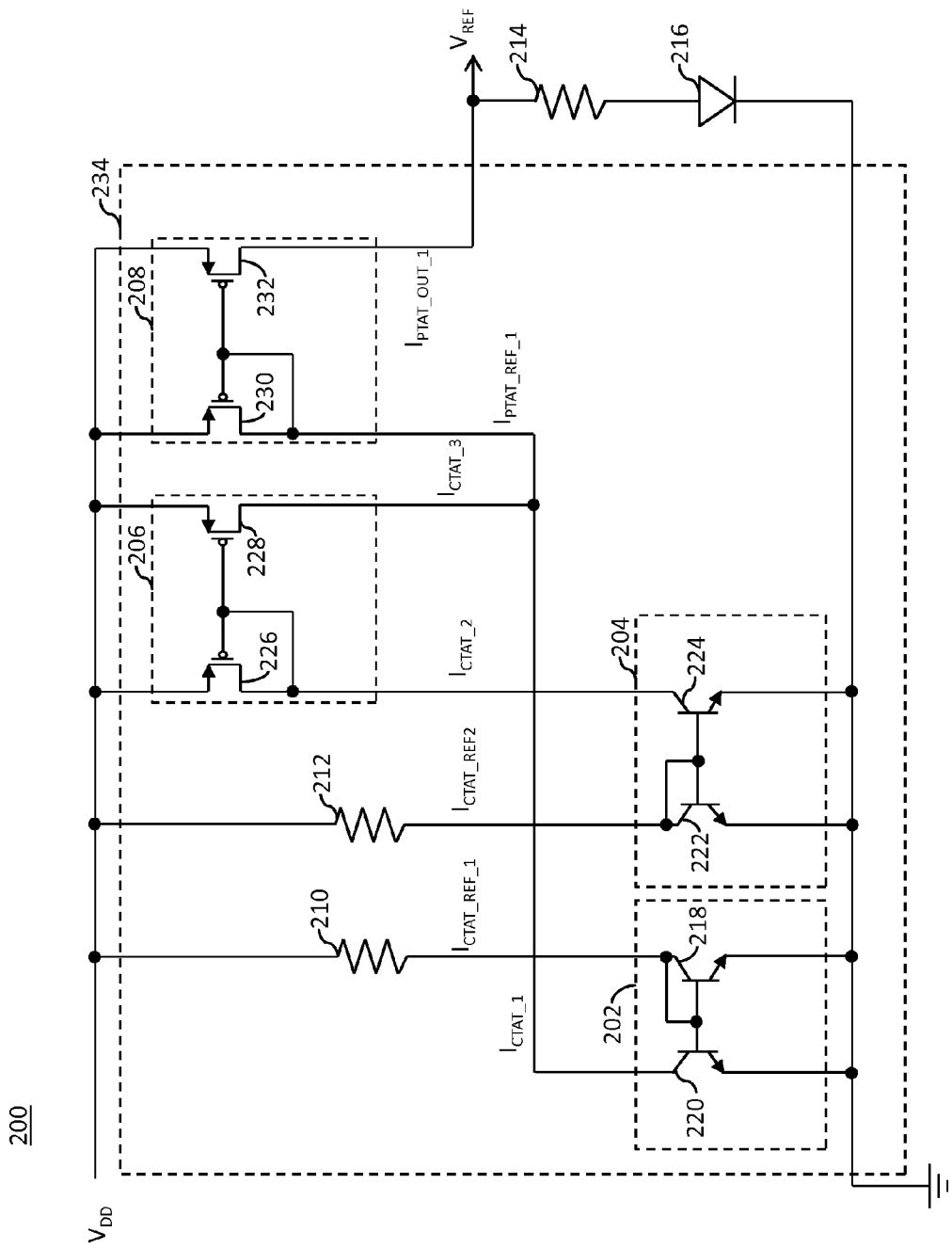
FIG. 2 is a schematic circuit diagram of the reference voltage generator of FIG. 1 in accordance with an embodiment of the present invention.

Referring now to FIG. 2, a schematic circuit diagram of an embodiment of a reference voltage generator 200 in accordance with an embodiment of the present invention is shown. The reference voltage generator 200 includes first through fourth current mirrors 202-208, third through fifth resistors 210-214, and a first diode 216. The first current mirror 202 includes first and second transistors 218 and 220. The second current mirror 204 includes third and fourth transistors 222 and 224. The third current mirror 206 includes fifth and sixth transistors 226 and 228, and the fourth current mirror 208 includes seventh and eighth transistors 230 and 232. The first through fourth current mirrors 202-208 and the third and fourth resistors 210 and 212 form a proportional-to-absolute-temperature (PTAT) current source 234. In the presently preferred embodiment, the first through fourth transistors 218-224 are negative-positive-negative bipolar junction transistors (NPN BJTs) and the fifth through eighth transistors 226-232 are p-channel metal-oxide semiconductor (PMOS) transistors.

The third and fourth resistors 210 and 212 have first terminals that receive the supply voltage $V_{DD}$ and second terminals that output first and second complementary-to-absolute-temperature (CTAT) reference currents $I_{CTAT\_REF\_1}$ and $I_{CTAT\_REF\_2}$, respectively. The value of the first CTAT reference current (given by expression 1) depends on a voltage difference between the base and emitter terminals of the first transistor 218 ($V_{BE1}$), and the value of the second CTAT reference current (given by expression 2) depends on a voltage difference between the base and emitter terminals of the third transistor 222 ($V_{BE2}$).

$$I_{DTAT\_REF\_1} = (V_{DD} - V_{BE1})/R_3 \quad (1)$$

$$I_{DTAT\_REF\_2} = (V_{DD} - V_{BE2})/R_4 \quad (2)$$

where,
$R_3$=a resistance value of the third resistor 210, and
$R_4$=a resistance value of the fourth resistor 212.

Since $V_{BE1}$ and $V_{BE2}$ exhibit CTAT characteristics, the first and second CTAT reference currents also exhibit CTAT characteristics.

The collector of the first transistor 218 is connected to the third resistor 210 and receives the first CTAT reference current. The emitter of the first transistor 218 is connected to ground, and the base of the first transistor 218 is connected to its collector.

The second transistor 220 has a base terminal connected to the base terminal of the first transistor 218, and an emitter connected to ground. A first CTAT current ($I_{CTAT\_1}$) is generated at the collector of the second transistor 220, and is a mirrored version of the first CTAT reference current.

The collector of the third transistor 222 is connected to the fourth resistor 212 and receives the second CTAT reference current. The emitter of the third transistor 222 is connected to ground and the base of the third transistor 222 is connected to the collector of the third transistor 222.

The fourth transistor 224 has a base terminal connected to the base terminal of the third transistor 222, and an emitter connected to ground. A second CTAT current ($I_{CTAT\_2}$) is generated at the collector of the fourth transistor 224. The second CTAT current is a mirrored version of the second CTAT reference current. In one embodiment, the ratio of a size of the first transistor 218 to that of the second transistor 220 is 12:12 and the ratio of a size of the third transistor 222 to that of the fourth transistor 224 is 2:2.

The fifth transistor 226 has a drain terminal connected to the collector of the fourth transistor 224, a gate terminal connected to its drain terminal, and a source terminal that receives the supply voltage.

The sixth transistor 228 has a gate terminal connected to the gate terminal of the fifth transistor 226, a source terminal that receives the supply voltage, and a drain terminal connected to the collector of the second transistor 220 and to a drain terminal of the seventh transistor 230. A third CTAT current ($I_{CTAT\_3}$) is generated at the drain of the sixth transistor 228 and is a mirrored version of the second CTAT current $I_{CTAT\_2}$.

The seventh transistor 230 has a gate terminal connected to its drain terminal, and a source terminal connected to the supply voltage. The drain terminal of the seventh transistor 230 is connected to the collector terminal of the second transistor 220 and the drain terminal of the sixth transistor 228, and generates a first PTAT reference current ($I_{PTAT\_REF\_1}$) that is substantially equal to the difference between the first and third CTAT currents ($I_{CTAT\_1} - I_{CTAT\_3}$). Hence, the value of the first PTAT reference current depends on the difference between $V_{BE1}$ and $V_{BE2}$.

The eighth transistor 232 has a gate terminal connected to the gate terminal of the seventh transistor 230, a source terminal connected to the supply voltage, and a drain terminal that generates a first PTAT output current ($I_{PTAT\_OUT\_1}$) which is a mirrored version of the first PTAT reference current $I_{PTAT\_REF\_1}$.

The fifth resistor 214 has a first terminal connected to the drain terminal of the eighth transistor 232 to receive the first PTAT output current and provides the reference voltage signal $V_{REF}$. A second terminal of the fifth resistor 214 is connected to an anode of the first diode 216, while a cathode of the first diode 216 is connected to ground.

Figure 3:
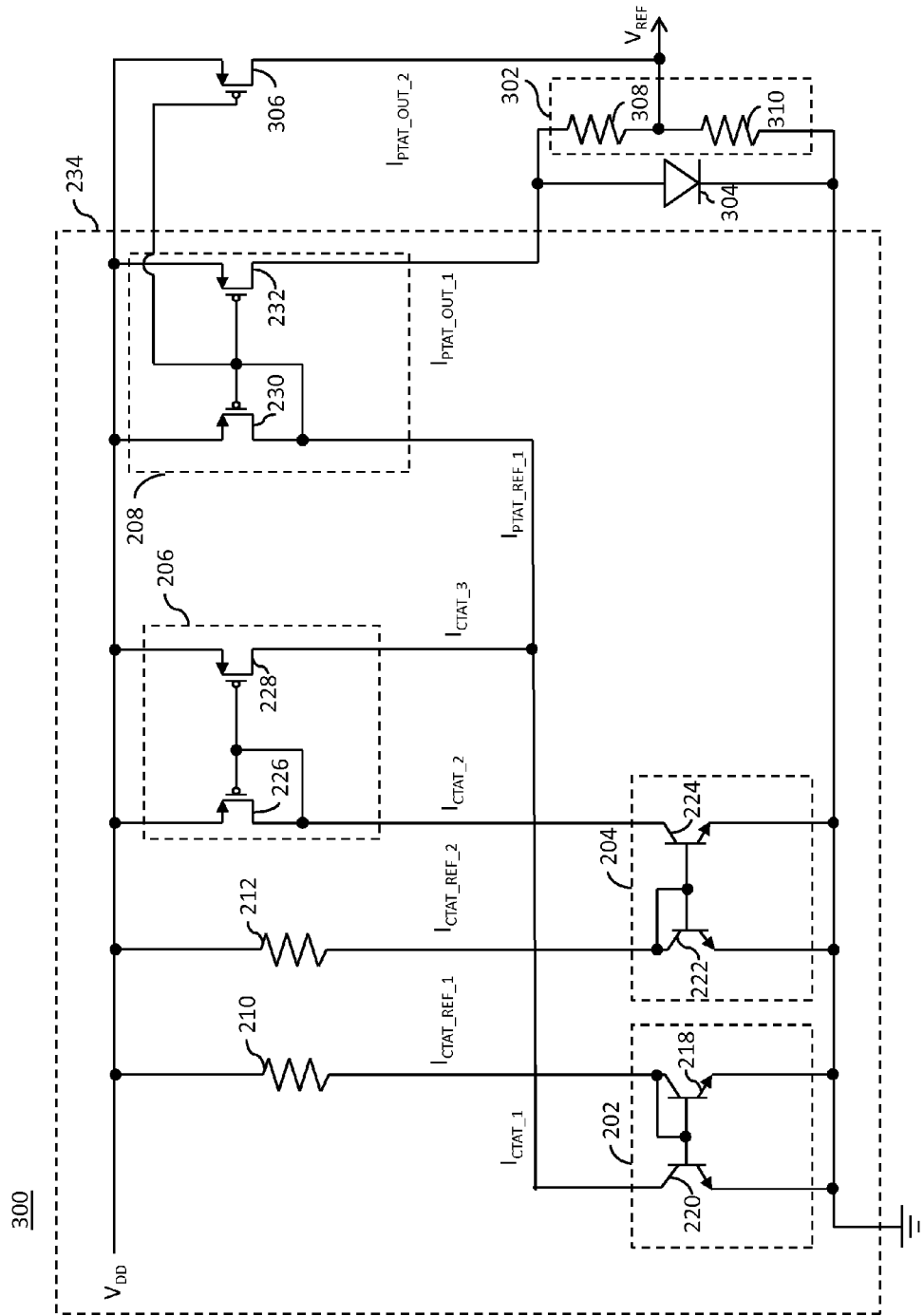
FIG. 3 is a schematic circuit diagram of the reference voltage generator of FIG. 1 in accordance with another embodiment of the present invention.

Referring now to FIG. 3, a schematic circuit diagram of a reference voltage generator 300 in accordance with another embodiment of the present invention is shown. The reference voltage generator 300 includes the PTAT current source 234, a second resistive network 302, a second diode 304, and a ninth transistor 306. In one embodiment, the ninth transistor 306 is a PMOS transistor.

The ninth transistor 306 has a gate terminal connected to the gate terminal of the seventh transistor 230, a source terminal that receives the supply voltage, and a drain terminal that generates a second PTAT output current ($I_{PTAT\_OUT\_2}$) which is a mirrored version of the first PTAT reference current $I_{PTAT\_OUT\_1}$. The ninth transistor 306 may be formed as a part of the fourth current mirror 208.

The second diode 304 has an anode connected to the drain terminal of the eighth transistor 232 and a cathode connected to ground.

In one embodiment, the second resistive network 302 is a voltage divider and includes sixth and seventh resistors 308 and 310 connected in series. The sixth resistor 308 has a first terminal connected to the drain terminal of the eighth transistor 232, and the seventh resistor 310 has a first terminal connected to ground. The node between the sixth and seventh resistors 308 and 310 is connected to the drain terminal of the ninth transistor 306, and receives the second PTAT output current $I_{PTAT\_OUT\_2}$ and outputs the reference voltage signal $V_{REF}$.

Figure 4:
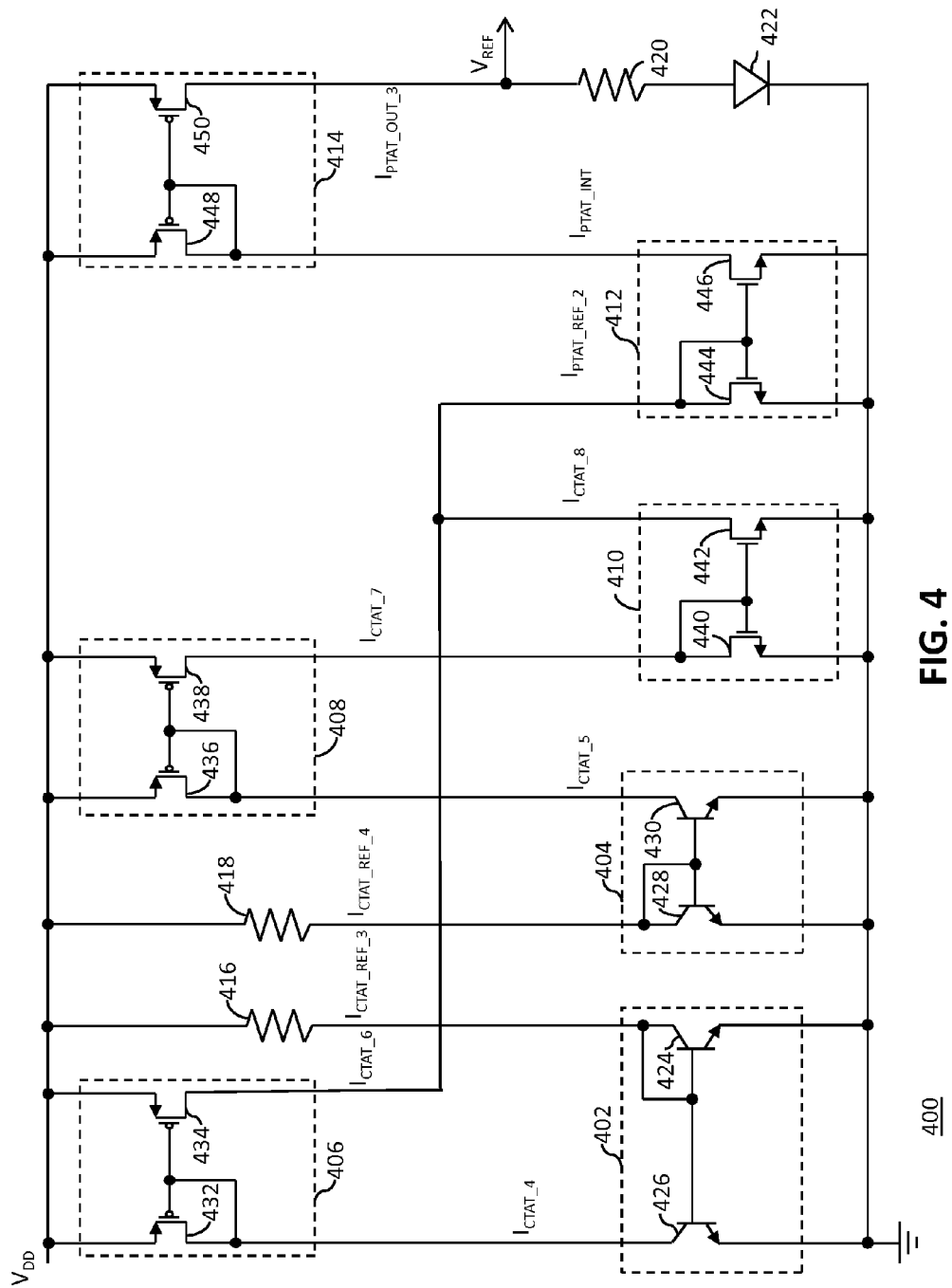
FIG. 4 is a schematic circuit diagram of the reference voltage generator of FIG. 1 in accordance with yet another embodiment of the present invention.

Referring now to FIG. 4, a schematic circuit diagram of a reference voltage generator 400 in accordance with yet another embodiment of the present invention is shown. The reference voltage generator 400 includes fifth through eleventh current mirrors 402-414, eighth through tenth resistors 416-420, and a third diode 422. The fifth current mirror 402 includes tenth and eleventh transistors 424 and 426. The sixth current mirror 404 includes twelfth and thirteenth transistors 428 and 430. The seventh current mirror 406 includes fourteenth and fifteenth transistors 432 and 434. The eighth current mirror 408 includes sixteenth and seventeenth transistors 436 and 438. The ninth current mirror 410 includes eighteenth and nineteenth transistors 440 and 442. The tenth current mirror 412 includes twentieth and twenty-first transistors 444 and 446, and the eleventh current mirror 414 includes twenty-second and twenty-third transistors 448 and 450. In one embodiment, the tenth through thirteenth transistors 424-430 are NPN BJTs, the fourteenth through seventeenth transistors 432-438 and the twenty-second and twenty-third transistors 448 and 450 are PMOS transistors, and the eighteenth through twenty-first transistors 440-446 are n-channel MOS (NMOS) transistors.

The eighth and ninth resistors 416 and 418 have first terminals connected to the supply voltage and second terminals that output third and fourth CTAT reference currents ($I_{CTAT\_REF\_3}$ and $I_{CTAT\_REF\_4}$), respectively. The value of the third CTAT reference current (given by expression 3) depends on a voltage difference between the base and emitter terminals of the tenth transistor 424 ($V_{BE3}$), and the value of the fourth CTAT reference current (given by expression 4) depends on a voltage difference between the base and emitter terminals of the twelfth transistor 428 ($V_{BE4}$).

$$I_{DTAT\_REF\_3} = (V_{DD} - V_{BE3})/R_8 \quad (3)$$

$$I_{DTAT\_REF\_4} = (V_{DD} - V_{BE4})/R_9 \quad (4)$$

where, $R_8$ = a resistance value of the eighth resistor 416, and $R_9$ = a resistance value of the ninth resistor 418.

Since $V_{BE3}$ and $V_{BE4}$ exhibit CTAT characteristics, the third and fourth CTAT reference currents also exhibit CTAT characteristics.

The tenth transistor 424 has a collector connected to the second terminal of the eighth resistor 416 and receives the third CTAT reference current $I_{CTAT\_REF\_3}$, an emitter connected to ground, and a base connected to its collector.

The eleventh transistor 426 has a base terminal connected to the base terminal of the tenth transistor 424, and an emitter terminal connected to ground. The tenth transistor 426 generates a fourth CTAT current ($I_{CTAT\_4}$) at its collector terminal. The fourth CTAT current is a mirrored version of the third CTAT reference current.

The twelfth transistor 428 has a collector connected to the second terminal of the ninth resistor 418 and receives the fourth CTAT reference current $I_{CTAT\_REF\_4}$, an emitter connected to ground, and a base connected to its collector terminal.

The thirteenth transistor 430 has a base terminal connected to the base terminal of the twelfth transistor 428 and an emitter terminal connected to ground. The thirteenth transistor 430 generates a fifth CTAT current ($I_{CTAT\_5}$) at its collector terminal. The fifth CTAT current $I_{CTAT\_5}$ is a mirrored version of the fourth CTAT reference current $I_{CTAT}$=4. In one embodiment, a ratio of a size of the tenth transistor 424 to that of the eleventh transistor 426 is 12:12, and a ratio of a size of the twelfth transistor 428 to that of the thirteenth transistors 430 is 2:2.

The fourteenth transistor 432 has a drain terminal connected to the collector terminal of the eleventh transistor 426, a gate terminal connected to its drain terminal, and a source terminal connected to the supply voltage.

The fifteenth transistor 434 has a gate terminal connected to the gate terminal of the fourteenth transistor 432 and a source terminal connected to the supply voltage. The fifteenth transistor 434 generates a sixth CTAT current ($I_{CTAT\_6}$) at its drain terminal. The sixth CTAT current $I_{CTAT\_6}$ is a mirrored version of the fourth CTAT current $I_{CTAT\_4}$.

The sixteenth transistor 436 has a drain terminal connected to the collector terminal of the thirteenth transistor 430, a gate terminal connected to its drain terminal, and a source terminal connected to the supply voltage.

The seventeenth transistor 438 has a gate terminal connected to the gate terminal of the sixteenth transistor 436 and a source terminal connected to the supply voltage. The seventeenth transistor 438 generates a seventh CTAT current ($I_{CTAT\_7}$) at its drain terminal. The seventh CTAT current $I_{CTAT\_7}$ is a mirrored version of the fifth CTAT current $I_{CTAT\_5}$.

The eighteenth transistor 440 has a drain terminal connected to the drain terminal of the seventeenth transistor 438 and receives the seventh CTAT current $I_{CTAT\_7}$, a gate terminal connected to its drain terminal, and a source terminal connected to ground.

The nineteenth transistor 442 has a gate terminal connected to the gate terminal of the eighteenth transistor 440 and a source terminal connected to ground. The nineteenth transistor 442 generates an eighth CTAT current ($I_{CTAT\_8}$) at its drain terminal. The eighth CTAT current is a mirrored version of the seventh CTAT current.

The twentieth transistor 444 has a drain terminal connected to the drain terminals of the fifteenth and nineteenth transistors 434 and 442, a gate terminal connected to its drain terminal, and a source terminal connected to ground. The twentieth transistor 444 generates a second PTAT reference current ($I_{PTAT\_REF\_2}$) at its drain terminal. The value of the second PTAT reference current is substantially equal to the difference between the sixth and the eighth CTAT currents, and hence, depends on the difference between $V_{BE3}$ and $V_{BE4}$.

The twenty-first transistor 446 has a gate terminal connected to the gate terminal of the twentieth transistor 444 and a source terminal connected to ground. The twenty-first transistor 426 generates a PTAT intermediate current ($I_{PTAT\_INT}$) at its drain terminal. The PTAT intermediate current is a mirrored version of the second PTAT reference current.

The twenty-second transistor 448 has a drain terminal connected to the drain terminal of the twenty-first transistor 446, a gate terminal connected to its drain terminal, and a source terminal connected to the supply voltage.

The twenty-third transistor 450 has a gate terminal connected to the gate terminal of the twenty-second transistor 448 and a source terminal connected to the supply voltage. The twenty-third transistor 450 generates a third PTAT output current ($I_{PTAT\_OUT\_3}$) at its drain terminal. The third PTAT output current is a mirrored version of the PTAT intermediate current.

The tenth resistor 420 has a first terminal connected to the drain terminal of the twenty-third transistor 450 and receives the third PTAT output current, and outputs the reference voltage signal $V_{REF}$. A second terminal of the tenth resistor 420 is connected to an anode of the third diode 422. A cathode of the third diode 422 is connected to ground.

The reference voltage generator 104 (including embodiments 200, 300 and 400) generates a PTAT output current, and hence, a PTAT output voltage based on the difference between two CTAT currents. The reference voltage generator 104 generates a reference voltage that is a sum of the PTAT output voltage and a CTAT voltage, and hence, is less sensitive to variations in temperature. Further, the reference voltage generator 104 does not include a start-up circuit or a feedback loop, and hence, is very reliable. It will be apparent to those of skill in the art that the transistors and the resistors can be selected such that the PTAT output voltage compensates for variations in the reference voltage caused by variations in the CTAT voltage in order to provide a temperature-independent reference voltage. Further, the resistors (FIGS. 1-4) can be replaced with resistive networks (i.e., series connected resistors). The reference voltage generator 104 can be used in applications such as, but not limited to, regulation of supply voltages and safety applications.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A reference voltage generator for generating a reference voltage signal, comprising:
   first and second resistors having first terminals connected to a supply voltage, and second terminals that output first and second complementary-to-absolute-temperature (CTAT) reference currents, respectively;
   a first current mirror, connected between the second terminal of the first resistor and ground, that receives the first CTAT reference current and generates a first CTAT current;
   a second current mirror, connected between the second terminal of the second resistor and ground, that receives the second CTAT reference current and generates a second CTAT current;
   a third current mirror, connected between the supply voltage and the second current mirror, that receives the second CTAT current and generates a third CTAT current;
   a fourth current mirror, connected between the first and third current mirrors and the supply voltage, that receives the first and third CTAT currents and generates a proportional-to-absolute-temperature (PTAT) output current;
   a diode having a cathode connected to ground; and
   a third resistor having a first terminal connected to the fourth current mirror for receiving the PTAT output current and a second terminal connected to an anode of the diode, wherein the reference voltage signal is output from the first terminal of the third resistor.

2. The reference voltage generator of claim 1, wherein the first current mirror comprises:
   a first transistor having a collector terminal connected to the second terminal of the first resistor for receiving the first CTAT reference current, a base terminal connected to its collector terminal, and an emitter terminal connected to ground; and
   a second transistor having a base terminal connected to the base terminal of the first transistor, an emitter terminal connected to ground, and a collector terminal that generates the first CTAT current.

3. The reference voltage generator of claim 2, wherein the second current mirror comprises:
   a third transistor having a collector terminal connected to the second terminal of the second resistor for receiving the second CTAT reference current, a base terminal connected to its collector terminal, and an emitter terminal connected to ground; and
   a fourth transistor having a base terminal connected to the base terminal of the third transistor, an emitter terminal connected to ground, and a collector terminal that generates the second CTAT current.

4. The reference voltage generator of claim 3, wherein the third current mirror comprises:
- a fifth transistor having a drain terminal connected to the collector terminal of the fourth transistor, a gate terminal connected to its drain terminal, and a source terminal connected to the supply voltage; and
- a sixth transistor having a source terminal connected to the supply voltage, a gate terminal connected to the gate terminal of the fifth transistor, and a drain terminal that generates the third CTAT current.

5. The reference voltage generator of claim 4, wherein the fourth current mirror comprises:
- a seventh transistor having a drain terminal connected to the collector terminal of the second transistor and the drain terminal of the sixth transistor, a gate terminal connected to its drain terminal, and a source terminal connected to the supply voltage; and
- an eighth transistor having a source terminal connected to the supply voltage, a gate terminal connected to the gate terminal of the seventh transistor, and a drain terminal that generates the PTAT output current.

6. The reference voltage generator of claim 5, wherein:
- the anode of the diode is directly connected to the fourth current mirror for receiving the PTAT output current, and the cathode is connected to ground; and
- the third resistor comprises a pair of resistors connected in series with each other and in parallel with the diode, and the reference voltage signal is output from a node between the pair of resistors.

7. The reference voltage generator of claim 5, wherein the first through fourth transistors are negative-positive-negative bipolar junction transistors and the fifth through eighth transistors are p-channel metal-oxide semiconductor transistors.

8. A reference voltage generator for generating a reference voltage signal, comprising:
- first and second resistors having first terminals that receive a supply voltage and second terminals that output first and second complementary-to-absolute-temperature (CTAT) reference currents, respectively;
- a first current mirror, connected between the second terminal of the first resistor and ground, that receives the first CTAT reference current and generates a first CTAT current;
- a second current mirror, connected between the second terminal of the second resistor and ground, that receives the second CTAT reference current and generates a second CTAT current;
- a third current mirror, connected between the voltage supply and the first current mirror, that receives the first CTAT current and generates a third CTAT current;
- a fourth current mirror, connected between the supply voltage and the second current mirror, that receives the second CTAT current and generates fourth CTAT current;
- a fifth current mirror, connected between the fourth current mirror and ground, that receives the fourth CTAT current and generates a fifth CTAT current;
- a sixth current mirror connected to a first node between the third and fifth current mirrors, and to ground, and that receives a proportional-to-absolute-temperature (PTAT) reference current and generates an intermediate PTAT current;
- a seventh current mirror, connected between the supply voltage and the sixth current mirror, that receives the intermediate PTAT current and generates a PTAT output current;
- a diode having a cathode connected to ground; and
- a third resistor having a first terminal connected to the seventh current mirror for receiving the PTAT output current and a second terminal connected to an anode of the diode, wherein the reference voltage signal is generated at a second node between the seventh current mirror and the third resistor.

9. The reference voltage generator of claim 8, wherein:
the first current mirror comprises:
- a first transistor having a collector connected to the second terminal of the first resistor for receiving the first CTAT reference current, a base connected to its collector, and an emitter connected to ground; and
- a second transistor having a base connected to the base of the first transistor, an emitter connected to ground, and a collector that generates the first CTAT current; and the second current mirror comprises:
- a third transistor having a collector to the second terminal of the second resistor for receiving the second CTAT reference current, a base connected to its collector, and an emitter connected to ground; and
- a fourth transistor having a base connected to the base of the third transistor, an emitter connected to ground, and a collector that generates the second CTAT current.

10. The reference voltage generator of claim 9, wherein:
the third current mirror comprises:
- a fifth transistor having a source connected to the supply voltage, a drain connected to the collector of the second transistor for receiving the first CTAT current, and a gate connected to its drain; and
- a sixth transistor having a source connected to the supply voltage, a gate connected to the gate of the fifth transistor, and a drain that generates the third CTAT current; and the fourth current mirror comprises:
- a seventh transistor having a source connected to the supply voltage, a drain connected to the collector of the fourth transistor for receiving the second CTAT current, and a gate connected to its drain; and
- a eighth transistor having a source connected to the supply voltage, a gate connected to the gate of the seventh transistor, and a drain that generates the fourth CTAT current.

11. The reference voltage generator of claim 10, wherein:
the fifth current mirror comprises:
- a ninth transistor having source connected to ground, a drain connected to the drain of the eighth transistor for receiving the fourth CTAT current, and a gate connected to its drain; and
- a tenth transistor having a source connected to ground, a gate connected to the gate of the eighth transistor, and a drain that generates a fifth CTAT current;

the sixth current mirror comprises:
- an eleventh transistor having source connected to ground, a drain connected to the first node for receiving the PTAT reference current, and a gate connected to its drain; and
- a twelfth transistor having a source connected to ground, a gate connected to the gate of the eighth transistor, and a drain that generates the PTAT intermediate current; and the seventh current mirror comprises:
- an thirteenth transistor having source connected to the supply voltage, a drain connected to the drain of the twelfth transistor for receiving the intermediate PTAT current, and a gate connected to its drain; and a fourteenth transistor having a source connected to the supply voltage, a gate connected to the gate of the thirteenth transistor, and a drain that generates the PTAT output current and is connected to the first terminal of the third resistor.

12. An integrated circuit, comprising:
a resistive network, connected between a supply voltage and ground, that outputs a tapped signal;
a reference voltage generator that generates a reference voltage, comprising:
first and second resistors having first terminals connected to a supply voltage, and second terminals that output first and second complementary-to-absolute-temperature (CTAT) reference currents, respectively;
a first current mirror, connected between the second terminal of the first resistor and ground, that receives the first CTAT reference current and generates a first CTAT current;
a second current mirror, connected between the second terminal of the second resistor and ground, that receives the second CTAT reference current and generates a second CTAT current;
a third current mirror, connected between the supply voltage and the second current mirror, that receives the second CTAT current and generates a third CTAT current;
a fourth current mirror, connected between the first and third current mirrors and the supply voltage, that receives the first and third CTAT currents and generates a proportional-to-absolute-temperature (PTAT) output current;
a diode having a cathode connected to ground;
a third resistor having a first terminal connected to the fourth current mirror for receiving the PTAT output current and a second terminal connected to an anode of the diode, wherein the reference voltage signal is output from the first terminal of the third resistor; and
a comparator having a negative input terminal that receives the tapped signal, a positive input terminal that receives the reference voltage, and an output terminal that provides a reset signal.

13. The integrated circuit of claim 12, wherein the first current mirror comprises:
a first transistor having a collector connected to its base and to the second terminal of the first resistor for receiving the first CTAT reference current, and an emitter connected to ground; and
a second transistor having a base connected to the base of the first transistor, an emitter connected to ground, and a collector that generates the first CTAT current.

14. The integrated circuit of claim 13, wherein the second current mirror comprises:

a third transistor having a collector connected to its base and to the second terminal of the second resistor for receiving the second CTAT reference current, and an emitter connected to ground; and
a fourth transistor having a base connected to the base of the third transistor, an emitter connected to ground, and a collector that generates the second CTAT current.

15. The integrated circuit of claim 14, wherein the third current mirror comprises:
a fifth transistor having a drain connected to its gate and to the collector of the fourth transistor, and a source connected to the supply voltage; and
a sixth transistor having a source connected to the supply voltage, a gate connected to the gate of the fifth transistor, and a drain that generates the third CTAT current.

16. The integrated circuit of claim 15, wherein the fourth current mirror comprises:
a seventh transistor having a drain connected to the collector of the second transistor and the drain of the sixth transistor, a gate connected to its drain, and a source connected to the supply voltage; and
an eighth transistor having a source connected to the supply voltage, a gate connected to the gate of the seventh transistor, and a drain that generates the PTAT output current.

17. The reference voltage generator of claim 16, wherein:
the anode of the diode is directly connected to the fourth current mirror for receiving the PTAT output current, and the cathode is connected to ground; and
the third resistor comprises a pair of resistors connected in series with each other and in parallel with the diode, and the reference voltage signal is output from a node between the pair of resistors.

18. The integrated circuit of claim 16, wherein the first through fourth transistors are negative-positive-negative bipolar junction transistors and the fifth through eighth transistors are p-channel metal-oxide semiconductor transistors.

19. The integrated circuit of claim 12, further comprising a bandgap reference voltage generator connected to the comparator that receives the reset signal and generates a bandgap reference voltage signal.

20. The integrated circuit of claim 12, further comprising a comparison circuit, connected to the reference voltage generator and the bandgap reference voltage generator, that receives the reference voltage signal and the bandgap reference voltage signal, respectively, and generates a comparison signal that is active when a voltage level of the bandgap reference voltage signal exceeds the voltage level of the reference voltage signal.

* * * * *